(12) United States Patent
Harada (10) Patent No.: US 12,062,587 B2
(45) Date of Patent: Aug. 13, 2024

(54) SEMICONDUCTOR DEVICE (71) Applicant: Mitsubishi Electric Corporation, Tokyo (JP)

(72) Inventor: Masatake Harada, Fukuoka (JP)

(73) Assignee: Mitsubishi Electric Corporation, Tokyo (JP)

(*) Notice: Subject to any disclaimer, the term of this patent is extended or adjusted under 35 U.S.C. 154(b) by 523 days.

(21) Appl. No.: 16/911,288

(22) Filed: Jun. 24, 2020

(65) Prior Publication Data
US 2021/0225718 A1 Jul. 22, 2021

(30) Foreign Application Priority Data

Jan. 20, 2020 (JP) .................................. 2020-006976

(51) Int. Cl.
H01L 23/053 (2006.01)
H01L 23/31 (2006.01)
H01L 25/18 (2023.01)

(52) U.S. Cl.
CPC ........ *H01L 23/053* (2013.01); *H01L 23/3107* (2013.01); *H01L 25/18* (2013.01)

(58) Field of Classification Search
CPC ............... H01L 23/053; H01L 23/3107; H01L 23/49575; H01L 21/565
See application file for complete search history.

(56) References Cited

U.S. PATENT DOCUMENTS 5,625,536 A * 4/1997 Soyano .................. H01L 23/24
174/529
5,753,971 A * 5/1998 Miller ................... H01L 25/072
257/690
6,396,125 B1 * 5/2002 Soyano .................. H01L 23/16
257/47

(Continued)

FOREIGN PATENT DOCUMENTS

JP 2015164165 A * 9/2015
JP 2017-152472 A 8/2017

(Continued)

OTHER PUBLICATIONS

Machine translation of JP2017152472A (Year: 2017).*

(Continued)

*Primary Examiner* — Dale E Page
*Assistant Examiner* — John M Parker
(74) *Attorney, Agent, or Firm* — Studebaker & Brackett PC (57) ABSTRACT According to the present disclosure, a semiconductor device includes a substrate, a semiconductor chip provided on the substrate, a case having a wall portion provided on the substrate and surrounding the semiconductor chip, and an overhang protruding from the wall portion toward an inside of a region surrounded by the wall portion and a resin that fills the region surrounded by the wall portion, wherein the overhang has an upper surface, and an inclined surface that is provided below the upper surface and on which a distance to the substrate decreases with an increase in distance from (Continued)

a tip of the overhang, the overhang being provided with a through hole penetrating from the inclined surface to the upper surface, and the through hole extends perpendicularly from the inclined surface.

21 Claims, 7 Drawing Sheets

(56) References Cited

U.S. PATENT DOCUMENTS

| | | | | |
|---|---|---|---|---|
| 6,995,461 | B2* | 2/2006 | Soyano | H01L 23/24 |
| | | | | 257/678 |
| 2020/0248742 | A1* | 8/2020 | Yamada | F16F 9/54 |
| 2020/0286840 | A1 | 9/2020 | Kaji et al. | |
| 2021/0118815 | A1 | 4/2021 | Kosugi | |

FOREIGN PATENT DOCUMENTS

| | | | |
|---|---|---|---|
| JP | 2017152472 A | * | 8/2017 |
| WO | 2019/008828 A1 | | 1/2019 |
| WO | 2019/234984 A1 | | 12/2019 |

OTHER PUBLICATIONS

Machine translation of JP2015164165A (Year: 2015).*
An Office Action issued by the German Patent and Trade Mark Office on Aug. 2, 2022, which corresponds to German Patent Application No. 102020131301.2 and is related to U.S. Appl. No. 16/911,288; with English language translation.
An Office Action; "Notice of Reasons for Refusal," mailed by the Japanese Patent Office on Jan. 10, 2023, which corresponds to Japanese Patent Application No. 2020-006976 and is related to U.S. Appl. No. 16/911,288; with English language translation.

* cited by examiner

SEMICONDUCTOR DEVICE

BACKGROUND OF THE INVENTION

Field

The present disclosure relates to a semiconductor device.

Background

JP 2017-152472 A discloses a semiconductor apparatus including a substrate, a case surrounding a region on the substrate, a resin with which the case is filled, and a semiconductor device covered with the resin. The case has a wall portion extending upward and a protrusion connected to the wall portion and protruding in a direction to the center of the substrate. The protrusion of the case is provided with a through hole penetrating the protrusion. When bubbles are entrained upon the entry of the resin into a region between the protrusion and the substrate, the bubbles escape from the through hole. Hence the region between the protrusion and the substrate can be filled with the resin without any gap.

In the semiconductor apparatus of JP 2017-152472 A, an acute-angled portion is formed at the edge of the protrusion forming the entrance of the through hole. Bubbles might be caught in the acute-angled portion. There is thus a possibility that it becomes difficult to bring bubbles into the through hole and remove the bubbles on the upper surface side of the protrusion. In this instance, the bubbles need to be screened by X-ray inspection, and labor in manufacturing might increase.

SUMMARY

The present disclosure has been made to solve the problem described above, and it is an object of the present disclosure to provide a semiconductor device that facilitates removal of bubbles in a resin.

The features and advantages of the present disclosure may be summarized as follows.

According to the first disclosure, a semiconductor device includes a substrate, a semiconductor chip provided on the substrate, a case having a wall portion provided on the substrate and surrounding the semiconductor chip, and an overhang protruding from the wall portion toward an inside of a region surrounded by the wall portion and a resin that fills the region surrounded by the wall portion, wherein the overhang has an upper surface, and an inclined surface that is provided below the upper surface and on which a distance to the substrate decreases with an increase in distance from a tip of the overhang, the overhang being provided with a through hole penetrating from the inclined surface to the upper surface, and the through hole extends perpendicularly from the inclined surface.

According to the second disclosure, a semiconductor device includes a substrate, a semiconductor chip provided on the substrate, a case having a wall portion provided on the substrate and surrounding the semiconductor chip, and an overhang protruding from the wall portion toward an inside of a region surrounded by the wall portion and a resin that fills the region surrounded by the wall portion, wherein the overhang has an upper surface and a lower surface provided below the upper surface and is provided with a through hole penetrating from the lower surface to the upper surface, the through hole is formed of a first portion that extends from the lower surface and decreases in width with an increase in distance from the lower surface, and a second portion formed closer to the upper surface than the first portion, and a side surface of the overhang forming the second portion is inclined with respect to a side surface of the overhang forming the first portion.

According to the third disclosure, a semiconductor device includes a substrate, a semiconductor chip provided on the substrate, a case having a wall portion provided on the substrate and surrounding the semiconductor chip, and an overhang protruding from the wall portion toward an inside of a region surrounded by the wall portion and a resin that fills the region surrounded by the wall portion, wherein the overhang has an upper surface and a lower surface provided below the upper surface and is provided with a through hole penetrating from the lower surface to the upper surface, and on the lower surface side of the through hole, an edge of the overhang forming an entrance of the through hole is rounded.

Other and further objects, features and advantages of the disclosure will appear more fully from the following description.

DESCRIPTION OF EMBODIMENTS

A semiconductor device according to each embodiment will be described with reference to the accompanying drawings. Components identical or corresponding to each other are indicated by the same reference characters, and repeated description of them is avoided in some cases.

First Embodiment

Figure 1:
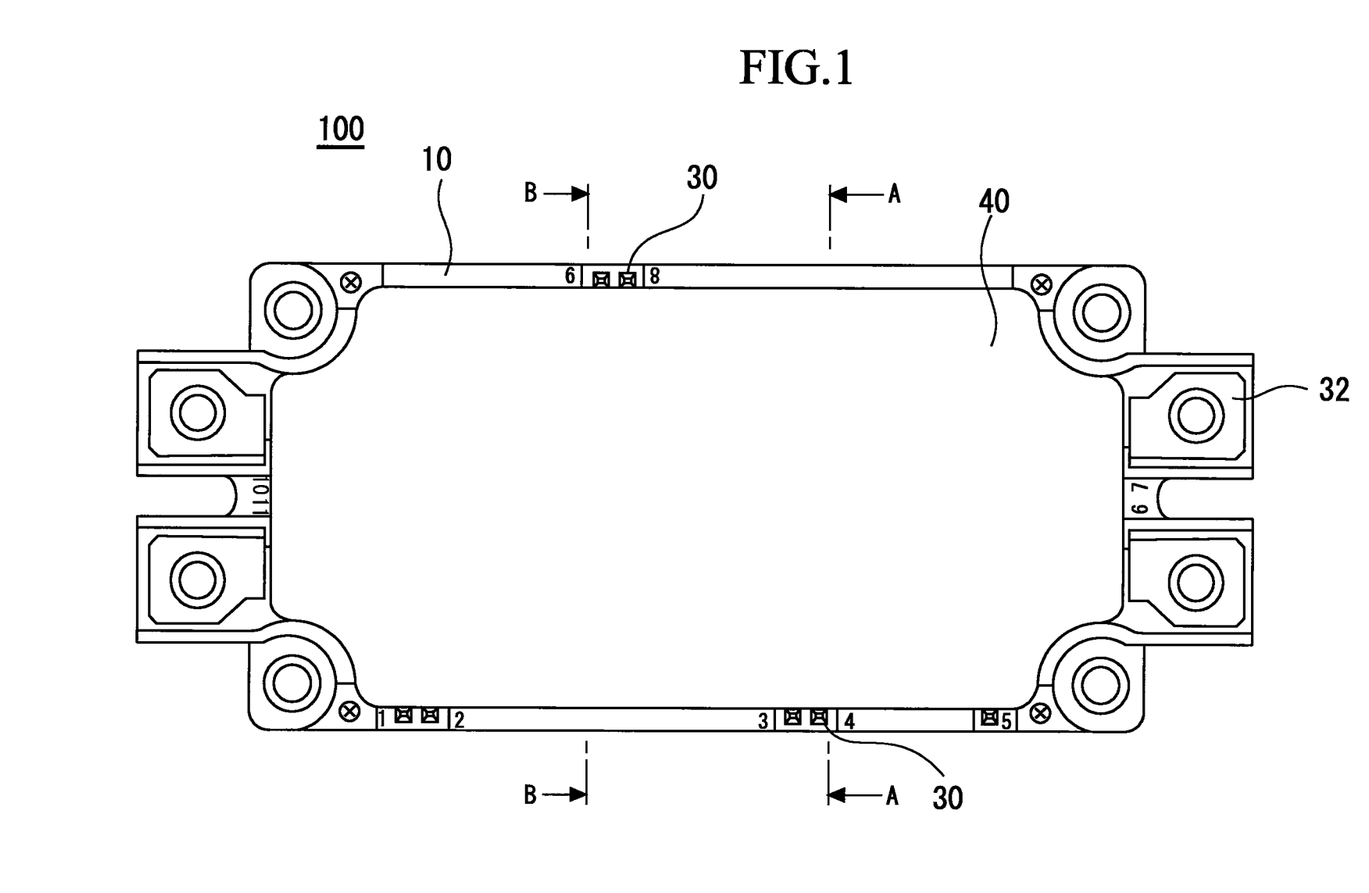
FIG. 1 is a plan view of a semiconductor device according to a first embodiment.

FIG. 1 is a plan view of a semiconductor device 100 according to a first embodiment. The semiconductor device 100 is, for example, a power converter. The semiconductor device 100 includes a case 10. The case 10 is, for example, an insertion case. Terminals 30, 32 are attached to the case 10. The terminal 30 is, for example, a signal terminal. The terminal 30 is provided on a long side of the case 10. The terminal 32 is, for example, a main terminal through which a large current flows. The terminal 32 is provided on a short side of the case 10. The shape of the case 10 and the type, shape, arrangement, and number of the terminals 30, 32 are not limited to those illustrated in FIG. 1.

The inside of the case 10 is filled with a resin 40. The resin 40 is, for example, an epoxy resin. The resin 40 is specially adjusted by, for example, matching coefficients of thermal expansion. The resin 40 may be adjusted so as to improve its adhesion to the case 10 or components in the case 10. The resin 40 is also referred to as a direct potting resin.

Figure 2:
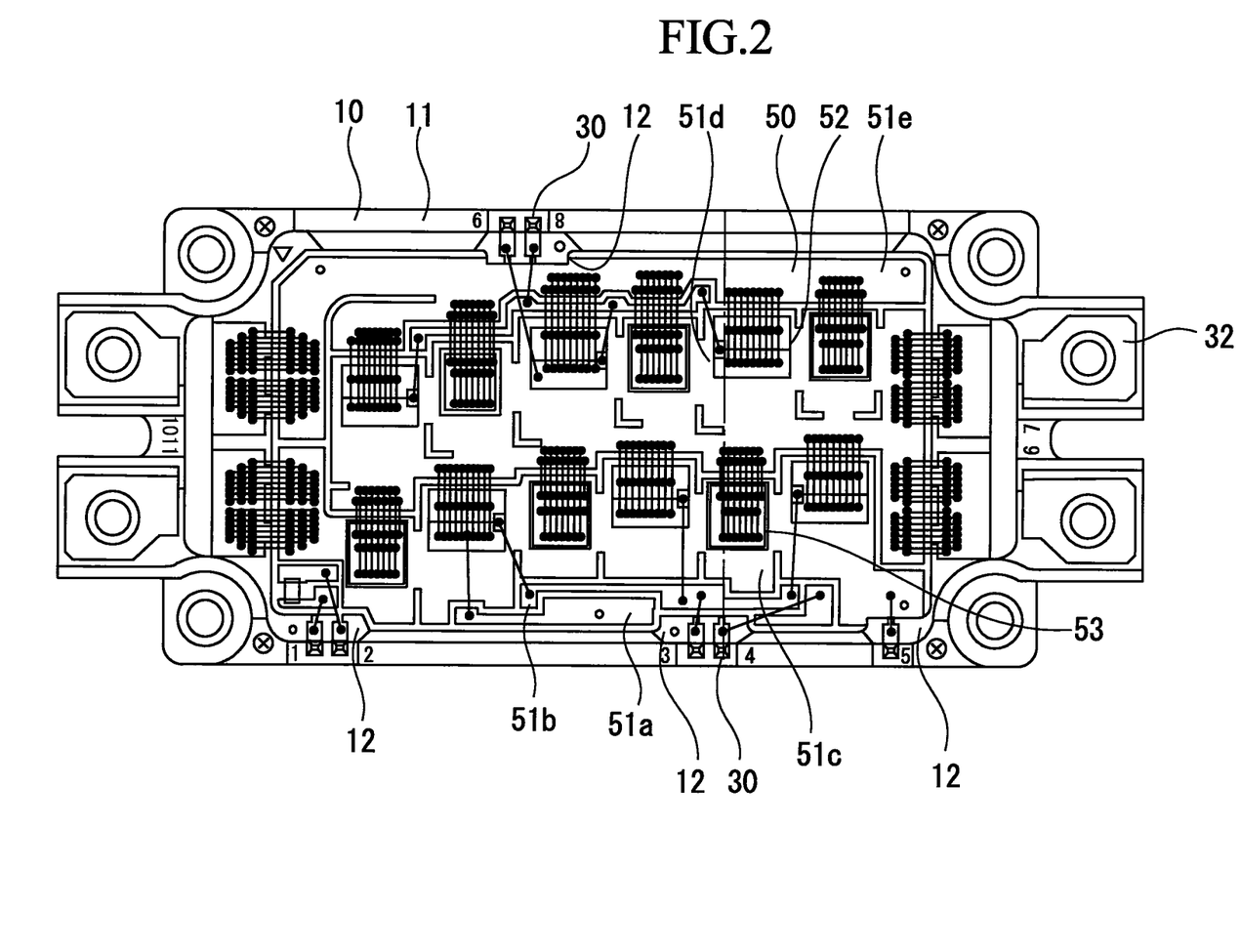
FIG. 2 is a plan view illustrating a state inside the case according to the first embodiment.

FIG. 2 is a plan view illustrating a state inside the case 10 according to the first embodiment. FIG. 2 illustrates a state in which the resin 40 has been removed from the semiconductor device 100. The semiconductor device 100 includes a substrate 50. The substrate 50 has metal patterns 51a, 51b, 51c, 51d, 51e. A semiconductor chip 52 is fixed to the metal pattern 51d. A semiconductor chip 53 is fixed to the metal pattern 51c.

The semiconductor chip 52 is, for example, an insulated-gate bipolar transistor (IGBT). The semiconductor chip 53 is, for example, a free-wheel diode. The semiconductor device 100 includes a plurality of semiconductor chips 52 and a plurality of semiconductor chips 53. The semiconductor device 100 is not limited thereto but may include at least one or more semiconductor chips.

The metal patterns 51a, 51b, 51c, 51d, 51e, the semiconductor chips 52, 53, and the terminals 30, 32 are connected with wires to constitute a predetermined circuit. The wire is, for example, an Al wire.

Figure 3:
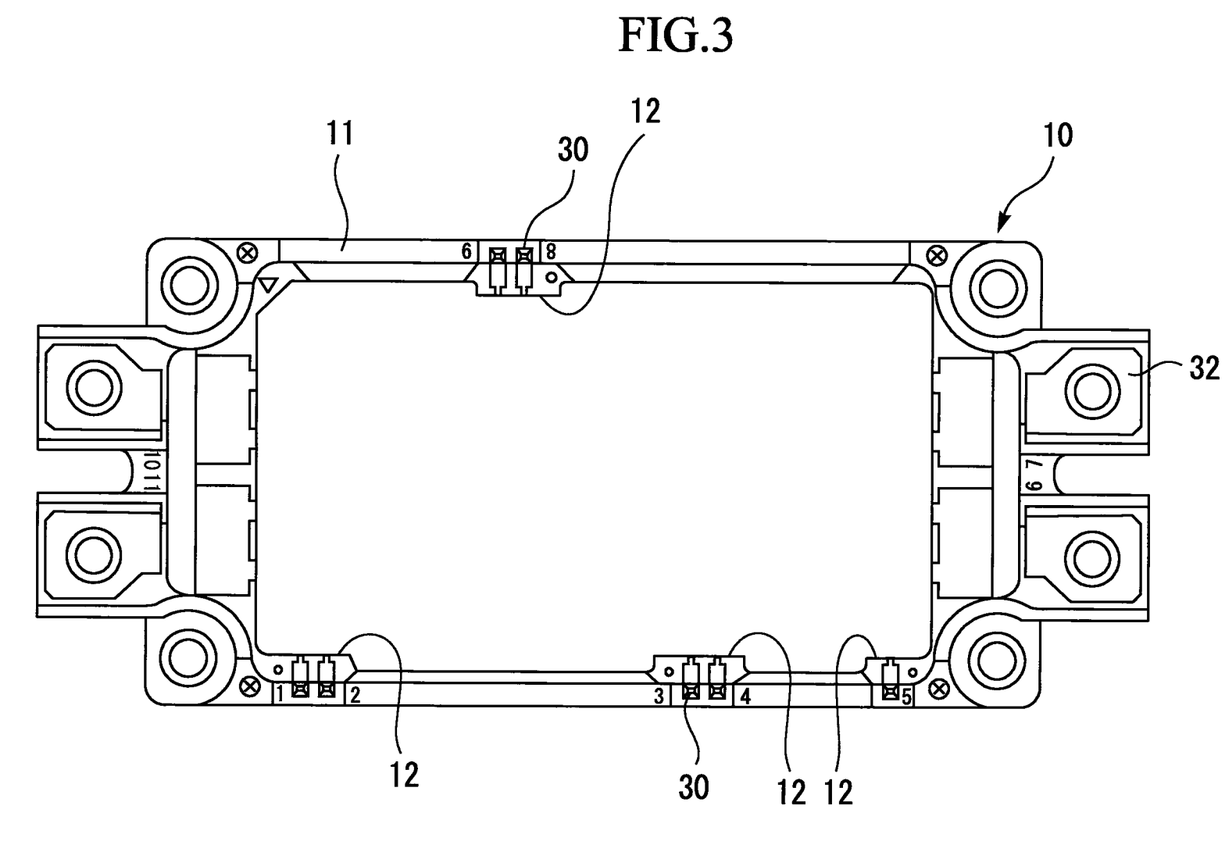
FIG. 3 is a plan view of the case and the terminals according to the first embodiment.

FIG. 3 is a plan view of the case 10 and the terminals 30, 32 according to the first embodiment. An overhang 12 protruding toward a central part of the semiconductor device 100 is formed in the case 10. The case 10 has four overhangs 12. A terminal 30 is mounted on the upper surface of the overhang 12. Note that numeral written in a portion adjacent to each of the terminals 30, 32 in the case 10 represents a number of each of the terminals 30, 32.

Figure 4:
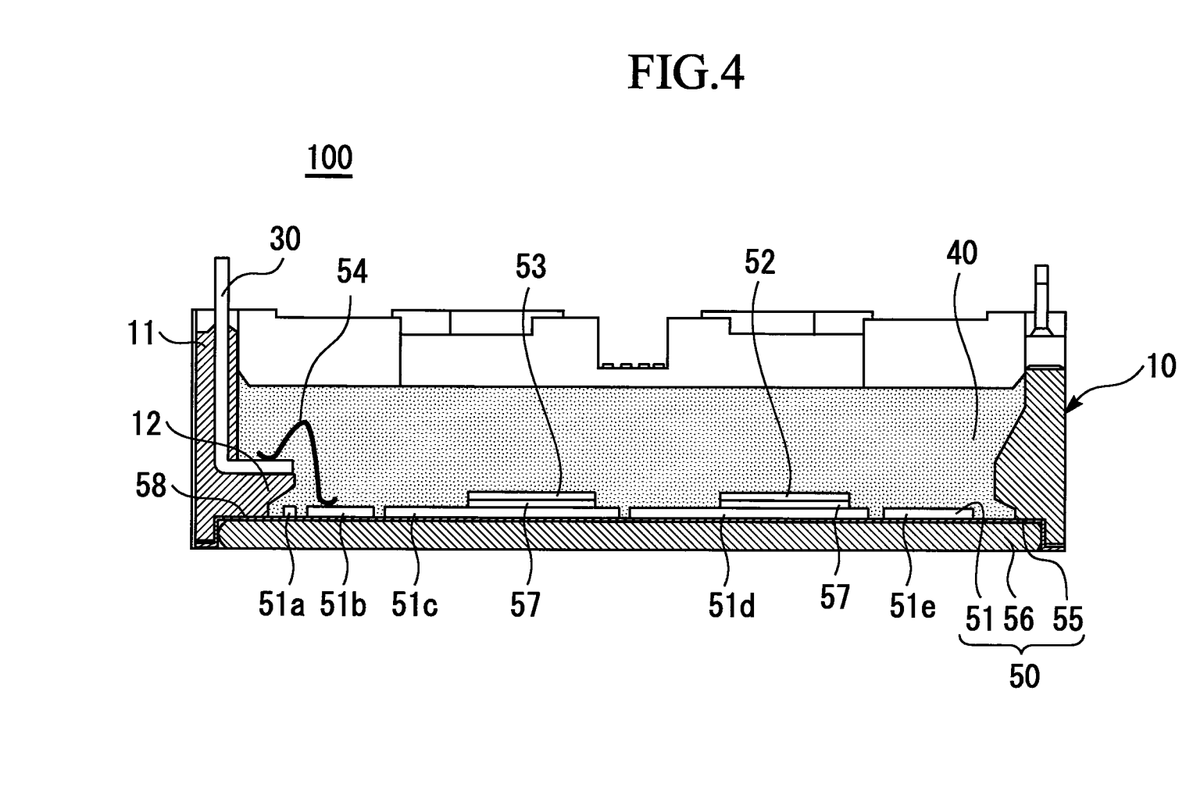
FIG. 4 is a cross-sectional view obtained by cutting the semiconductor device according to the first embodiment along a line A-A.

FIG. 4 is a cross-sectional view obtained by cutting the semiconductor device 100 according to the first embodiment along a line A-A. The line A-A is a line passing through the overhang 12 and the terminal 30. The substrate 50 includes a base plate 56, an insulating plate 55 provided on the base plate 56, and a metal pattern 51 provided on the insulating plate 55. The base plate 56 is formed of a metal. The metal pattern 51 includes metal patterns 51a, 51b, 51c, 51d, 51e. The metal pattern 51 is formed of, for example, copper. The substrate 50 is also referred to as a resin-insulated copper base plate.

The semiconductor chips 52, 53 are provided on the substrate 50. The semiconductor chip 52 is bonded to the metal pattern 51d with a solder 57. The semiconductor chip 53 is bonded to the metal pattern 51c with a solder 57.

The case 10 surrounds a mounting region of electronic components on the substrate 50. The case 10 has a wall portion 11 and the overhang 12. The wall portion 11 is provided on the substrate 50 and extends upward. The wall portion 11 surrounds the semiconductor chips 52, 53. The overhang 12 protrudes from the wall portion 11 toward the inside of a region surrounded by the wall portion 11. The overhang 12 protrudes toward the center of the substrate 50.

The region surrounded by the wall portion 11 is filled with the resin 40. The semiconductor chips 52, 53 are covered with the resin 40. The terminal 30 is provided on the upper surface of the overhang 12. A wire 54 is fixed to the terminal 30. The terminal 30 is electrically connected to the semiconductor chip 53 through the wire 54 and a metal pattern 51b. In FIG. 4, wires except for the wire 54 are omitted.

By providing the overhang 12, the terminal 30 can be mounted on the overhang 12. Further, the metal pattern 51 can be positioned under the overhang 12. In FIG. 4, the metal pattern 51a is provided immediately under the overhang 12. By a part of the metal pattern 51 entering under the overhang 12, the mounting area of the metal pattern 51 can be increased as compared to when the metal pattern 51 is not present under the overhang 12. It is thus possible to reduce the size of the semiconductor device 100.

Figure 5:
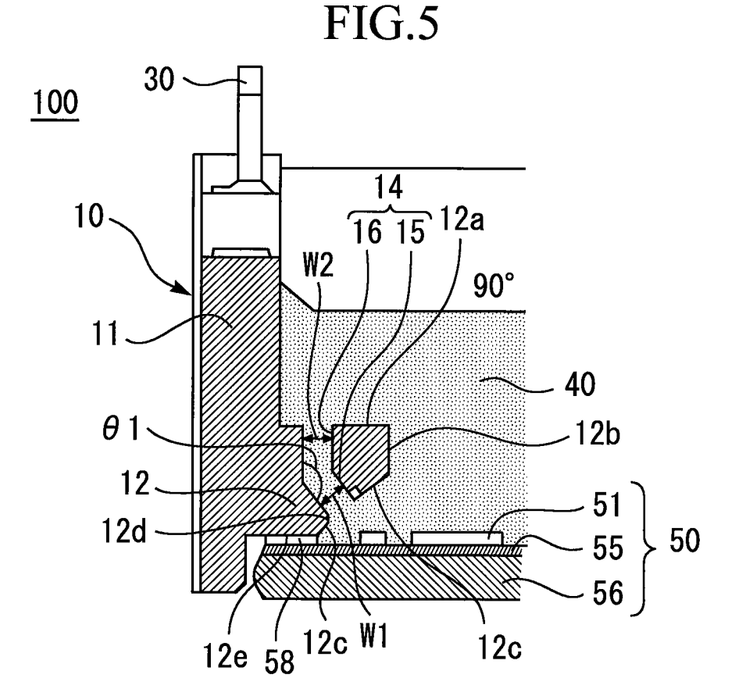
FIG. 5 is an enlarged view of a cross section obtained by cutting the semiconductor device according to the first embodiment along a line B-B.

FIG. 5 is an enlarged view of a cross section obtained by cutting the semiconductor device 100 according to the first embodiment along a line B-B. The line B-B passes through the overhang 12. The overhang 12 has an upper surface 12a and an inclined surface 12c provided below the upper surface 12a. The upper surface 12a is parallel to the upper surface of the substrate 50 or the base plate 56. The upper surface 12a and the inclined surface 12c are connected by a side surface 12b. The side surface 12b is provided at the tip of the overhang 12. On the inclined surface 12c, a distance to the substrate 50 decreases with an increase in distance from the tip of the overhang 12.

In the overhang 12, a through hole 14 penetrating from the inclined surface 12c to the upper surface 12a is formed. The through hole 14 extends perpendicularly from the inclined surface 12c. The through hole 14 is filled with the resin 40. The through hole 14 is, for example, circular in a plan view.

The overhang 12 has a perpendicular surface 12d at a portion forming the entrance of the through hole 14. The perpendicular surface 12d is connected to the inclined surface 12c. The perpendicular surface 12d is perpendicular to the upper surface of the substrate 50. A portion of the inclined surface 12c on the tip side of the overhang 12 with respect to the through hole 14 and a portion of the inclined surface 12c on the wall portion 11 side with respect to the through hole 14 are parallel.

A lower surface 12e is connected to the side opposite to the side surface 12b of the inclined surface 12c. The lower surface 12e is parallel to the upper surface of the substrate 50. The lower surface 12e is fixed to the upper surface of the substrate 50 through an adhesive 58. Thereby, the case 10 is fixed to the substrate 50.

The through hole 14 is formed of a first portion 15 extending perpendicularly from the inclined surface 12c and a second portion 16 inclined to the tip side of the overhang 12 with respect to the first portion 15 and extending to the upper surface 12a of the overhang 12. The through hole 14 changes its direction in the middle. The second portion 16 is perpendicular to the upper surface 12a of the overhang 12. An angle θ1 formed by the first portion 15 and the second portion 16 is an obtuse angle. For example, θ1 is 120° to 135°.

The diameter of the through hole 14 is constant from its entrance to exit. That is, a diameter W1 of the first portion 15 is equal to a diameter W2 of the second portion 16. The diameter of the through hole 14 is, for example, 1.0 mm.

The through hole 14 is formed to remove bubbles from the through hole 14 when the bubbles are entrained in the resin 40 between the overhang 12 and the substrate 50. The bubbles enter the through hole 14 from the inclined surface 12c side, and escape above the overhang 12 from the upper surface 12a.

Figure 6:
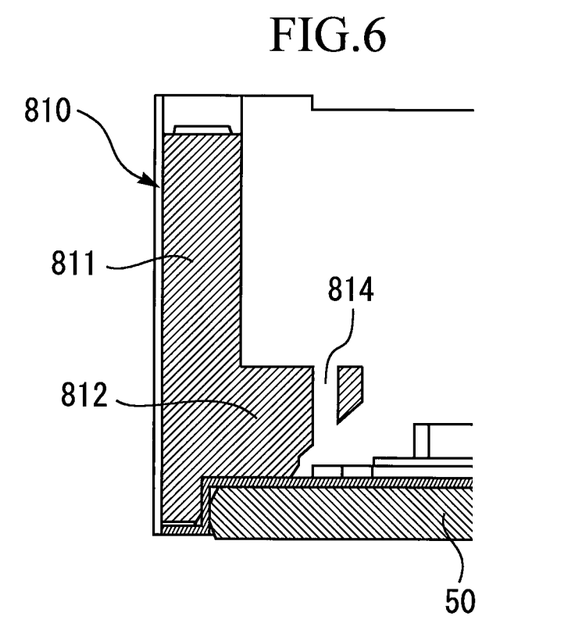
FIG. 6 is a cross-sectional view of a semiconductor device according to a comparative example of the first embodiment.

FIG. 6 is a cross-sectional view of a semiconductor device according to a comparative example of the first embodiment. The semiconductor device according to the comparative example includes a case 810. The case 810 has a wall portion 811 and an overhang 812. A through hole 814 is formed in the overhang 812. The through hole 814 is perpendicular to the upper surface of the substrate 50. For this reason, an acute-angled portion is formed at a location on the lower surface side of the overhang 812 where the entrance of the through hole 814 is formed. At this time, there is a possibility that bubbles pierce the acute-angled portion of the case 810 and hardly escape therefrom.

In contrast, in the present embodiment, the through hole 14 is formed in a direction perpendicular to the inclined surface 12c of the overhang 12. For this reason, an acute-angled portion is not formed at the edge of the overhang 12 which forms the entrance for the bubbles getting into the through hole 14. Thus, even when bubbles are entrained upon injection of a sealing material, it is possible to facilitate removal of the bubbles from the through hole 14. Thereby, a region between the overhang 12 and the substrate 50 can be filled with the resin 40 without a gap. It is thus possible to improve the insulation of the semiconductor device 100. In addition, screening of bubbles by X-ray inspection or the like can be omitted and the manufacturing process can be simplified.

When the through hole 14 is not bent, the overhang 12 may become long so that the through hole 14 penetrates to the upper surface 12a. Further, there is a possibility that the through hole 14 becomes long. In contrast, in the present embodiment, the through hole 14 is bent at the boundary between the first portion 15 and the second portion 16. Hence the overhang 12 can be prevented from becoming longer than necessary. Further, the through hole 14 can be shortened.

The angle θ1 formed by the first portion 15 and the second portion 16 is an obtuse angle. It is thus possible to prevent bubbles from being caught inside the through hole 14. The second portion 16 extends perpendicularly to the upper surface 12a of the overhang 12. This facilitates guiding of bubbles to the upper surface 12a side.

In the present embodiment, the through hole 14 has been formed of the linear first portion 15 and the linear second portion 16. The through hole 14 is not limited thereto but may be curved. The angle θ1 formed by the first portion 15 and the second portion 16 may be a right angle or an acute angle. The diameter of the through hole 14 may not be constant. The second portion 16 may not be perpendicular to the upper surface 12a of the overhang 12.

Figure 7:
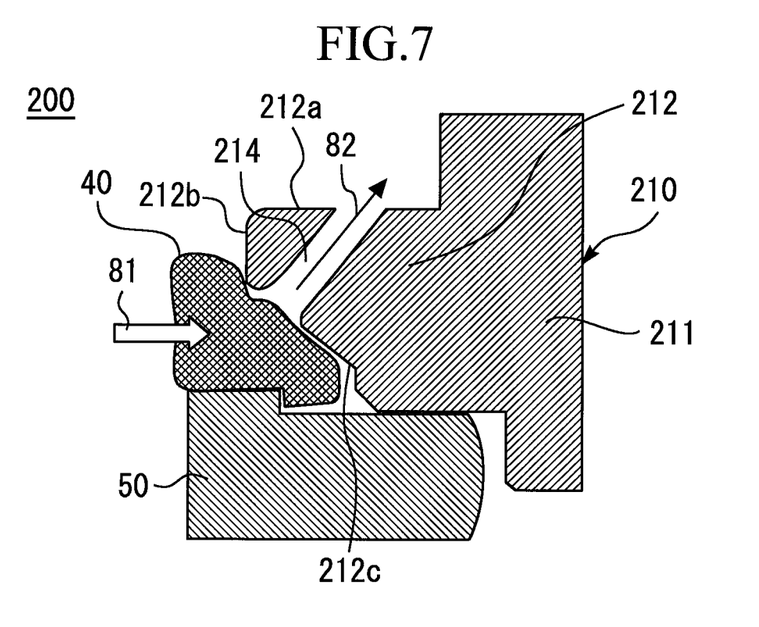
FIG. 7 is an enlarged view of a cross section of a semiconductor device according to a modification of the first embodiment.

FIG. 7 is an enlarged view of a cross section of a semiconductor device 200 according to a modification of the first embodiment. The semiconductor device 200 includes a case 210. The case 210 has a wall portion 211 and an overhang 212. The overhang 212 has an upper surface 212a and an inclined surface 212c provided below the upper surface 212a. The upper surface 212a and the inclined surface 212c are connected by a side surface 212b. The side surface 212b is provided at the tip of the overhang 212.

In the overhang 212, a through hole 214 penetrating from the inclined surface 212c to the upper surface 212a is formed. The through hole 214 extends perpendicularly from the inclined surface 212c. The through hole 214 is linear. As thus described, the through hole 214 does not need to be bent.

In addition, by the through hole 214 extending perpendicularly from the inclined surface 212c, an angle of a direction 81 in which the resin 40 flows and an angle of a direction 82 in which the bubbles escape are close, as compared to when the through hole 214 is perpendicular to the upper surface of the substrate 50. This can further facilitate removal of the bubbles extruded from the resin 40.

In the present embodiment, the end of the overhang 12 has been formed of the side surface 12b that is the flat surface. The end of the overhang 12 is not limited thereto but may be formed of a curved surface. Further, the end of the overhang 12 may be sharp.

The semiconductor chips 52, 53 may be made with a wide-bandgap semiconductor. The wide-bandgap semiconductor is, for example, silicon carbide, gallium nitride-based material or diamond. Thereby, the semiconductor device 100 can be further reduced in size.

These modifications can be appropriately applied to semiconductor devices according to embodiments below. Meanwhile, for the semiconductor devices according to the embodiments below, dissimilarities with the first embodiment will mainly be explained as they have many similarities with the first embodiment.

Second Embodiment

Figure 8:
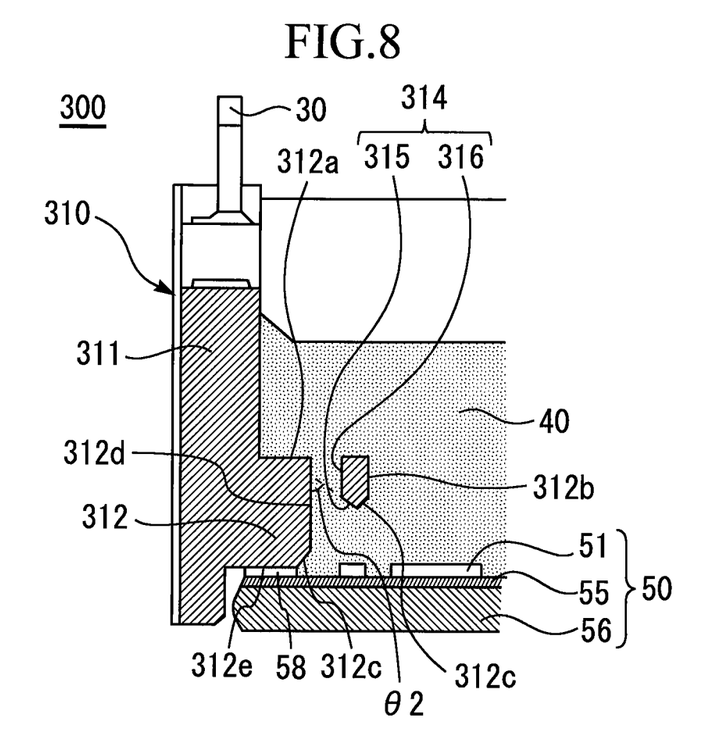
FIG. 8 is an enlarged view of a cross section of a semiconductor device according to a second embodiment.

FIG. 8 is an enlarged view of a cross section of a semiconductor device 300 according to a second embodiment. The semiconductor device 300 includes a case 310. The case 310 has a wall portion 311 and an overhang 312. A through hole 314 is formed in the overhang 312. In the present embodiment, the shape of the through hole 314 is different from that in the first embodiment. The other configuration is the same as that in the first embodiment.

The overhang 312 has an upper surface 312a and a lower surface 312c provided below the upper surface 312a. A side surface 312b is provided between the upper surface 312a and the lower surface 312c. The side surface 312b is provided at the tip of the overhang 312. The lower surface 312c is an inclined surface on which a distance to the substrate 50 decreases with an increase in distance from the tip of the overhang 312. The lower surface 312e is connected to the side opposite to the side surface 312b of the lower surface 312c. The lower surface 312e is parallel to the upper surface of the substrate 50. The lower surface 312e is fixed to the upper surface of the substrate 50 through the adhesive 58.

In the overhang 312, a through hole 314 penetrating from the lower surface 312c to the upper surface 312a is formed. The through hole 314 is filled with the resin 40. The through hole 314 is formed of a first portion 315 and a second portion 316. The first portion 315 extends from the lower surface 312c and decreases in width with an increase in distance from the lower surface 312c. The first portion 315 is, for example, conical. The second portion 316 is formed closer to the upper surface 312a than the first portion 315 and has a uniform width. The second portion 316 extends perpendicularly to the upper surface 312a of the overhang 312. A side surface 312d of the overhang 312 forming the through hole 314 is perpendicular to the upper surface of the substrate 50. The upper surface 312a and the lower surface 312c are connected by the side surface 312d.

The first portion 315 of the through hole 314 is tapered. In contrast, the diameter of the second portion 316 connecting the first portion 315 and the upper surface 312a is constant. The diameter of the through hole 314 at the lower surface 312c is, for example, 3.0 mm. The diameter of the through hole 314 at the upper surface 312a is, for example, 1.0 mm.

A taper angle θ2 of the first portion 315 is an acute angle of less than 90 degrees. Here, the taper angle θ2 is an angle formed by the side surface 312d and a portion facing the side surface 312d in a cross-sectional view among the side surfaces of the overhang 312 forming the first portion 315.

Figure 9:
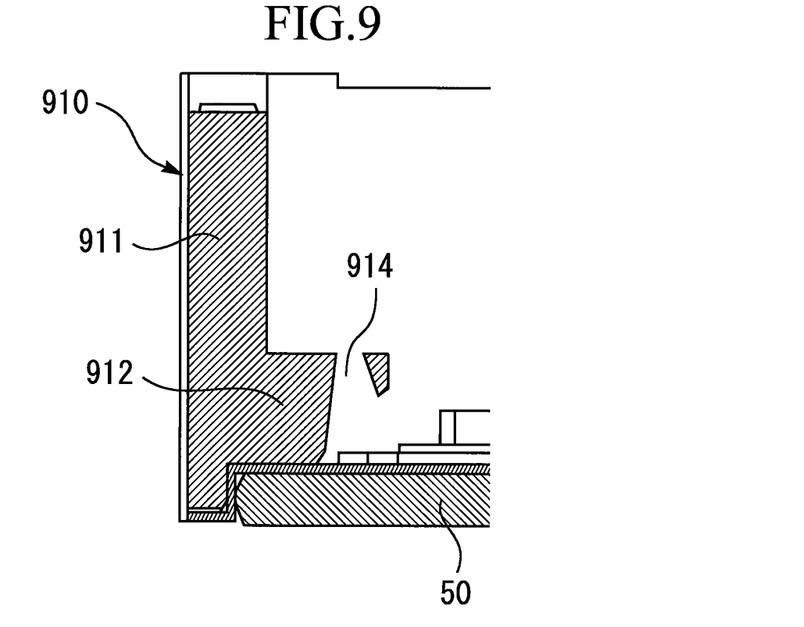
FIG. 9 is a cross-sectional view of a semiconductor device according to a comparative example of the second embodiment.

FIG. 9 is a cross-sectional view of a semiconductor device according to a comparative example of the second embodiment. The semiconductor device according to the comparative example includes a case 910. The case 910 has a wall portion 911 and an overhang 912. A conical through hole 914 is formed in the overhang 912. A taper angle of the through hole 914 is constant from the entrance to the exit of the through hole 914.

With such a configuration, the diameter of the through hole 914 at the lower surface of the overhang 912 might become large. Hence there is a possibility that many portions of the overhang 912 are cut so as to form the through hole 914. In this instance, the rigidity of the case 910 might not be maintained. In particular, the case 910 is likely to swing at the time of wire bonding, and there is a possibility that bonding failure occurs.

When the diameter of the through hole 914 at the lower surface of the overhang 912 is reduced, the diameter of the through hole 914 at the upper surface of the overhang 912 becomes even smaller. This might make it difficult to remove bubbles. It is also conceivable that when the taper angle of the through hole 914 is reduced, the effect of guiding bubbles to the through hole 914 decreases.

In contrast, in the present embodiment, the through hole 314 is formed of the tapered first portion 315 and the linear second portion 316. That is, the taper angle becomes smaller in the middle of the through hole 314. As a result, on the entrance side for bubbles, the tapered first portion 315 can guide bubbles to easily remove the bubbles in the resin 40. Further, enlarging the entrance for bubbles enables the bubbles to easily enter the through hole 314 even when the bubbles are large. Moreover, providing the second portion 316 enables reduction in the portion of the overhang 312 which is shaved to form the through hole 314. Therefore, the rigidity of the case 310 can be maintained. Thereby, the swinging of the case 310 at the time of wire bonding is prevented, and bonding failure can be prevented.

As a modification of the present embodiment, the diameter of the second portion 316 may not be constant. That is, the second portion 316 may be tapered. At this time, the side surface of the overhang 312 forming the second portion 316 only needs to be inclined with respect to the side surface of the overhang 312 forming the first portion 315. For example, the second portion 316 may be narrowed toward the upper surface 312a and have a smaller taper angle than the first portion 315. Also, in this instance, the portion of the overhang 312 which is shaved to form the through hole 314 can be reduced by the second portion 316 having a smaller taper angle. The second portion 316 may increase in width with a decrease in distance to the upper surface 312a. This can facilitate removal of bubbles on the upper surface 312a side.

The through hole 314 may be formed of the first portion 315, the second portion 316, and a third portion formed on the upper surface 312a side of the second portion 316. That is, the second portion 316 only needs to be formed closer to the upper surface 312a than the first portion 315 and may not reach the upper surface 312a.

The lower surface 312c is not limited to the inclined surface but may be a surface parallel to the upper surface of the substrate 50 or the upper surface 312a of the overhang 312.

Third Embodiment

Figure 10:
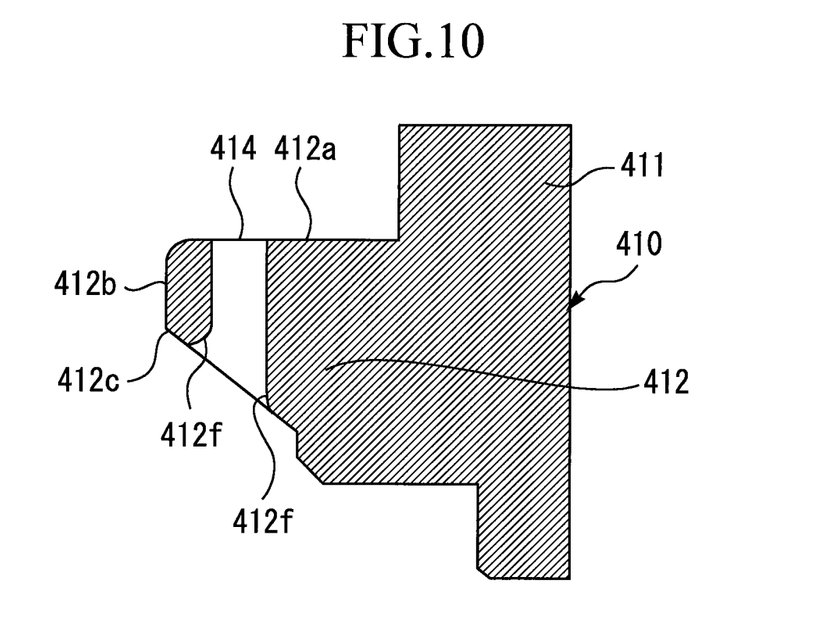
FIG. 10 is an enlarged view of a cross section of a case according to a third embodiment.

FIG. 10 is an enlarged view of a cross section of a case 410 according to a third embodiment. The case 410 has a wall portion 411 and an overhang 412. A through hole 414 is formed in the overhang 412. In the present embodiment, the shape of the through hole 414 is different from that in the first embodiment. The other configuration is the same as that in the first embodiment.

The overhang 412 has an upper surface 412a and a lower surface 412c provided below the upper surface 412a. A side surface 412b is provided between the upper surface 412a and the lower surface 412c. The side surface 412b is provided at the tip of the overhang 412. The lower surface 412c is an inclined surface on which a distance to the substrate 50 decreases with an increase in distance from the tip of the overhang 412.

In the overhang 412, a through hole 414 penetrating from the lower surface 412c to the upper surface 412a is formed. The through hole 414 is perpendicular to the upper surface 412a of the overhang 412. On the lower surface 412c side of the through hole 414, an edge 412f of the overhang 412 forming the entrance of the through hole 414 is rounded. It is thereby possible to facilitate entry of bubbles into the through hole 414. In addition, it is possible to prevent bubbles from being caught at the entrance of the through hole 414.

The shape of the through hole 414 of the present embodiment is not limited to that illustrated in FIG. 10. For example, on the entrance side for bubbles of each of the through holes 14, 214, 314 in the first and second embodiments, the edge of the overhang forming the entrance of the through hole may be rounded.

Meanwhile, technical features explained in each embodiment may be appropriately combined to use.

In the semiconductor device according to the first disclosure, the through hole extends perpendicularly from the inclined surface of the overhang. Hence an acute-angled portion is not formed at the entrance of the through hole, and it is possible to prevent bubbles from being caught at the entrance of the through hole. This can facilitate removal of bubbles in the resin.

In the semiconductor device according to the second disclosure, the through hole has the first portion that extends from the lower surface of the overhang and decreases in width with an increase in distance from the lower surface. This can facilitate removal of bubbles in the resin.

In the semiconductor device according to the third disclosure, the edge of the overhang forming the entrance of the through hole is rounded. It is thus possible to prevent bubbles from being caught at the edge of the overhang. This can facilitate removal of bubbles in the resin.

Obviously many modifications and variations of the present disclosure are possible in the light of the above teachings. It is therefore to be understood that within the scope of the appended claims the disclosure may be practiced otherwise than as specifically described.

The entire disclosure of a Japanese Patent Application No. 2020-006976, filed on Jan. 20, 2020 including specification, claims, drawings and summary, on which the Convention priority of the present application is based, are incorporated herein by reference in its entirety.

The invention claimed is:

1. A semiconductor device comprising:
   a substrate;
   a semiconductor chip provided on the substrate;
   a case having a wall portion provided on the substrate and surrounding the semiconductor chip, and an overhang protruding from the wall portion toward an inside of a region surrounded by the wall portion; and
   a resin that fills the region surrounded by the wall portion, wherein the overhang has an upper surface, and an inclined surface that is provided below the upper surface and on which a distance to the substrate decreases with an increase in distance from a tip of the overhang, the overhang being provided with a through hole penetrating from the inclined surface to the upper surface, and the through hole extends perpendicularly from the inclined surface.

2. The semiconductor device according to claim 1, wherein the through hole is formed of a first portion extending perpendicularly from the inclined surface, and a second portion inclined to the tip side of the overhang with respect to the first portion and extending to the upper surface.

3. The semiconductor device according to claim 2, wherein the second portion is perpendicular to the upper surface.

4. The semiconductor device according to claim 2, wherein an angle formed by the first portion and the second portion is an obtuse angle.

5. The semiconductor device according to claim 4, wherein the obtuse angle formed by the first and second portions is from 120° to 135°.

6. The semiconductor device according to claim 2, wherein the diameters of the through hole in each of the first and second portions are equal.

7. The semiconductor device according to claim 1, wherein on the inclined surface side of the through hole, an edge of the overhang forming an entrance of the through hole is rounded.

8. The semiconductor device according to claim 1, wherein the semiconductor chip is made with wide bandgap semiconductor.

9. The semiconductor device according to claim 8, wherein the wide bandgap semiconductor is silicon carbide, a gallium nitride-based material or diamond.

10. A semiconductor device comprising:
a substrate;
a semiconductor chip provided on the substrate;
a case having a wall portion provided on the substrate and surrounding the semiconductor chip, and an overhang protruding from the wall portion toward an inside of a region surrounded by the wall portion; and
a resin that fills the region surrounded by the wall portion,
wherein the overhang has an upper surface and a lower surface provided below the upper surface and is provided with a through hole penetrating from the lower surface to the upper surface,
the through hole is formed of a first portion that extends from the lower surface and decreases in width with an increase in distance from the lower surface, and a second portion formed closer to the upper surface than the first portion, and a side surface of the overhang forming the second portion is inclined with respect to a side surface of the overhang forming the first portion.

11. The semiconductor device according to claim 10, wherein the second portion has a uniform width.

12. The semiconductor device according to claim 10, wherein the lower surface is an inclined surface on which a distance to the substrate decreases with an increase in distance from a tip of the overhang.

13. The semiconductor device according to claim 10, wherein on the lower surface side of the through hole, an edge of the overhang forming an entrance of the through hole is rounded.

14. The semiconductor device according to claim 10, wherein the semiconductor chip is made with wide bandgap semiconductor.

15. The semiconductor device according to claim 14, wherein the wide bandgap semiconductor is silicon carbide, a gallium nitride-based material or diamond.

16. The semiconductor device according to claim 10, wherein a taper angle of the first portion formed by the side surface and a portion of the first portion facing the side surface is an acute angle of less than 90°.

17. The semiconductor device according to claim 10, wherein the second portion includes a taper in which the diameter of the through hole in the second portion decreases in a direction toward the upper surface.

18. A semiconductor device comprising:
a substrate;
a semiconductor chip provided on the substrate;
a case having a wall portion provided on the substrate and surrounding the semiconductor chip, and an overhang protruding from the wall portion toward an inside of a region surrounded by the wall portion; and
a resin that fills the region surrounded by the wall portion,
wherein the overhang has an upper surface and a lower surface provided below the upper surface and is provided with a through hole penetrating from the lower surface to the upper surface, and
on the lower surface side of the through hole, an edge of the overhang forming an entrance of the through hole is rounded.

19. The semiconductor device according to claim 18, wherein the semiconductor chip is made with wide bandgap semiconductor.

20. The semiconductor device according to claim 19, wherein the wide bandgap semiconductor is silicon carbide, a gallium nitride-based material or diamond.

21. The semiconductor device according to claim 18, wherein the through hole extends perpendicularly from the upper surface.

* * * * *